(12) United States Patent
Ishimura

(10) Patent No.: US 7,030,477 B2
(45) Date of Patent: Apr. 18, 2006

(54) OPTICAL SEMICONDUCTOR DEVICE

(75) Inventor: Eitaro Ishimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/052,932

(22) Filed: Feb. 9, 2005

(65) Prior Publication Data

US 2005/0194663 A1    Sep. 8, 2005

(30) Foreign Application Priority Data

Mar. 2, 2004 (JP) .............................. 2004-057744
Dec. 28, 2004 (JP) .............................. 2004-381567

(51) Int. Cl.
*H01L 23/02* (2006.01)
*H01L 29/06* (2006.01)

(52) U.S. Cl. ...................... 257/678; 257/704; 257/664; 257/731; 257/732; 257/733

(58) Field of Classification Search ................ 257/678, 257/664, 704, 691, 731, 732, 733
See application file for complete search history.

(56) References Cited

U.S. PATENT DOCUMENTS

| 6,797,887 | B1 * | 9/2004 | Kojima et al. | ....... 174/152 GM |
|---|---|---|---|---|
| 6,841,733 | B1 * | 1/2005 | Schiaffino et al. | ......... 174/52.5 |
| 6,885,563 | B1 * | 4/2005 | Panella et al. | ............... 361/794 |
| 6,900,512 | B1 * | 5/2005 | Kohmoto et al. | ........... 257/435 |
| 6,911,599 | B1 * | 6/2005 | Rosenberg et al. | ........ 174/52.5 |
| 6,940,091 | B1 * | 9/2005 | Funada et al. | ................. 257/21 |
| 2002/0031152 | A1 | 3/2002 | Funabashi et al. | |

FOREIGN PATENT DOCUMENTS

JP       61-107785       5/1986

OTHER PUBLICATIONS

J. Tatum et al., "Designing with the Honeywell 10Gbps TOSA and ROSA", pp. 1-4, Honeywell Application Note: HVAN: 1, Rev:2; 0603.

* cited by examiner

*Primary Examiner*—Jasmine Clark
(74) *Attorney, Agent, or Firm*—Leydig, Voit & Mayer, Ltd.

(57) ABSTRACT

A laser device includes a can package of a laser diode having a lead terminal secured to a through hole in a stem by a sealant, and a flexible substrate having a transmission line on a front surface of a polyimide film. The lead terminal of the can package and one end of a transmission line of the flexible substrate are connected by soldering. A resistor for matching the impedance of the transmission line and the impedance of the lead terminal is located in the vicinity of a connection of the transmission line and the lead terminal.

15 Claims, 11 Drawing Sheets

OPTICAL SEMICONDUCTOR DEVICE

BACKGROUND OF THE INVENTION

1. Field of the Invention

The present invention relates to an optical semiconductor device and, more particularly, to an optical semiconductor device that carries high-frequency signals used for optical communication or the like.

2. Description of the Related Art

In recent years, with the advancing broadband optical communication, the demand for transmitting a larger volume of information at lower cost has been accelerating concurrently with the increasingly disseminating public communication networks that use optical fibers. To increase the volume of information at low cost, it is necessary to achieve higher transmission speed. The transmission has been increased from 600 Mbps to 2.5 Gbps, and it is gradually being further increased to 10 Gbps. With this trend, light emitting devices and light receiving devices used with optical transmitters and receivers are being required to exhibit stable performance at high speed. At the same time, it is essential to develop inexpensive, highly efficient optical devices.

Many optical devices use inexpensive can packages shaped like trunk shafts to maintain low cost. The body of a can package is called a stem, and the stem is provided with a few rod-shaped lead terminals to propagate electrical signals. In an optical device using the can package, the lead terminals and a circuit board having a drive IC for driving the optical device are connected by soldering.

However, the lead terminals of the can package have high impedance, so that when the optical device is connected to the circuit board, electrical signals are reflected in their connection area, resulting in deteriorated signal waveforms as the frequency of an electrical signals increases. In particular, longer lead terminals make the deterioration of signal waveforms more prominent. It is, therefore, necessary to shorten the lead terminals to be connected to the circuit board as much as possible.

On the other hand, if the lead terminals are too short, then an external force applied to a can package cannot be absorbed by flexure of lead wires, resulting in a high stress to be developed at a soldered portion of the circuit board. This causes damage, such as unsoldering, in some cases.

As a solution to the aforesaid problem, a method has been used, in which the lead wires of the can package are soldered to a flexible substrate having transmission lines provided on a flexible strip-shaped dielectric film, and the can package is connected to the circuit board through the intermediary of the flexible substrate. This mounting method allows external forces applied to the can package to be absorbed by the flexure of the flexible substrate.

As a publicly known example of an optical device using such a flexible substrate, a configuration in which a laser package is mounted on a flexible substrate has been disclosed in, for example, Honeywell Application Note (HVAN 1 Rev 2; 0603, Honeywell VCSEL Optical Products, "Designing with the Honeywell 10 Gbps TOSA and ROSA", page 1 of 29 to page 4 of 29).

If static electricity or a surge voltage is applied to a lead terminal, a laser element provides an output beyond a maximum permissible output level, deteriorating the laser element. To restrain the deterioration of the laser element, a construction, in which a capacitor is provided in parallel to a semiconductor laser element and a resistor is provided in series with the semiconductor laser element in a can package, has been disclosed in, for example, Japanese Patent Laid-Open No. 2001-320125 (refer to the 1st line to the 4th line in the top right column of page 2, and the 5th line to the 10th line in the bottom left column of page 2; and also see FIG. 1 to FIG. 4).

However, if an optical device having the flexible substrate connected to the lead terminals of the can package by using the flexible substrate described above is connected to the circuit board for driving the optical device, reflection of high frequencies attributable to impedance mismatch takes place to a certain degree at a connection area between the circuit board and the flexible substrate and a connection area between the flexible substrate and the lead terminals of the can package.

A flexible substrate usually has a length of about 10 mm, so that if the reflected high frequencies described above are present, the flexible substrate acts as if it were a resonator having its both ends serving as base points, causing interference of high frequencies to take place. This generates surges having pitches of a few GHz when attention is focused on the frequency characteristics of transmission characteristic S21 and reflection characteristic S11. The surges cause a problem in that the waveforms of high-frequency signals propagating on the flexible substrate are distorted.

Taking a semiconductor laser device, for example, reflection S11 of high frequencies that takes place between the flexible substrate and the can package is normally larger than the reflection that takes place between the flexible substrate and the circuit board. This is because the impedance of the whole can package, including the resistance of a laser diode constituting the can package, the capacity of the stem, and the inductance of the lead terminals, changes intricately according to frequencies.

Hence, in a semiconductor laser device that performs direct modulation, high-frequency modulation signals that propagate on the flexible substrate are influenced by the surges of transmission characteristic S21 or reflection characteristic S11, posing a problem in that the modulation waveforms of the semiconductor laser are distorted, thus making it impossible to obtain good high frequency characteristics.

SUMMARY OF THE INVENTION

The present invention has been made with a view toward solving the problems described above, and it is an object of the present invention to provide an optical semiconductor device capable of minimizing distortion of waveforms of high-frequency signals that propagate on a flexible substrate by accomplishing impedance matching between the flexible substrate and a can package so as to restrain interference of high frequencies between a lead terminal of the can package and a transmission line of the flexible substrate.

According to one aspect of the invention, there is provided an optical semiconductor device comprising: an optical semiconductor package including a substrate that has a first main surface and a second main surface opposed each other, and a through hole penetrating the first and second main surfaces, a semiconductor optical element disposed on the first main surface of the substrate, an electrode terminal that is disposed in the through hole of the substrate with its one end exposed on the second main surface of the substrate, secured to the substrate through the intermediary of a sealant, and connected to the semiconductor optical element through a signal line, and a cap-shaped member covering the first main surface of the substrate and sealing the semiconductor optical element; a flexible substrate having a flexible dielectric film and a signal transmission line provided on a front surface of the dielectric film, a first end of the signal transmission line electrically connected to the electrode terminal of the optical semiconductor package on the second main surface side of the substrate of the optical semiconductor package; and impedance matching means matching an impedance at the first end of the signal transmission line of the flexible substrate and an impedance of the electrode terminal of the optical semiconductor package at the second main surface side of the substrate.

Accordingly, in the optical semiconductor device according to the present invention, impedances match at a connection area of a flexible substrate and an electrode terminal. This restrains the interference of high-frequency signals that takes place in the flexible substrate on the basis of the reflection of high-frequency signals at the connection area of the flexible substrate and the electrode terminal, thus reducing distorted waveforms of the high-frequency signals that propagate on the flexible substrate.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

The following will describe a laser device using a laser diode as an optical semiconductor element, as an example of an optical semiconductor device.

First Embodiment

Figure 1:
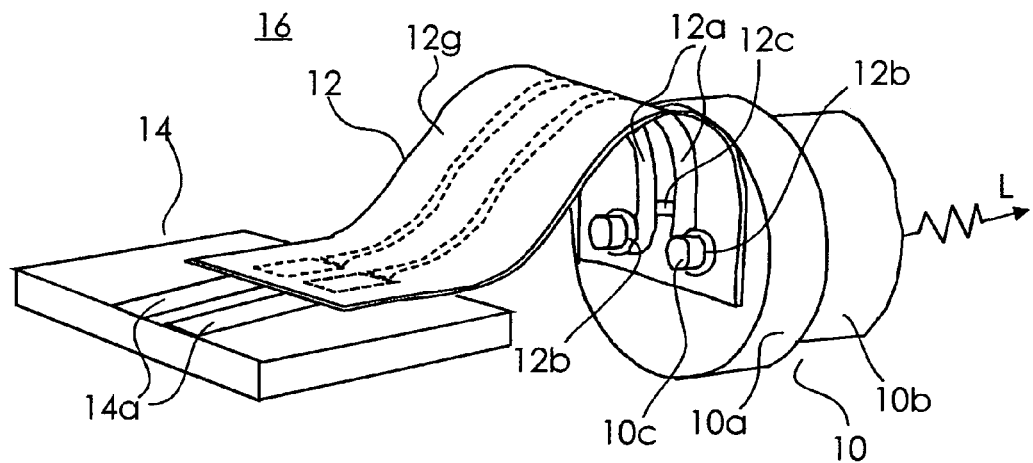
FIG. 1 is a perspective view of an optical semiconductor device according to an embodiment of the present invention.
Figure 2:
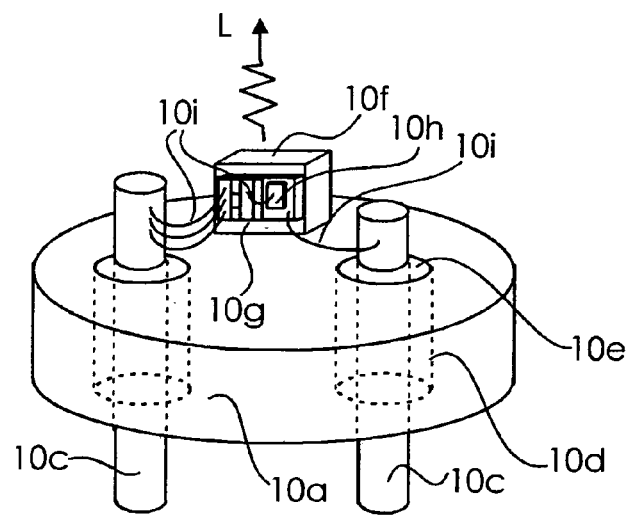
FIG. 2 is a perspective view showing the interior of a can package according to an embodiment of the present invention
Figure 3:
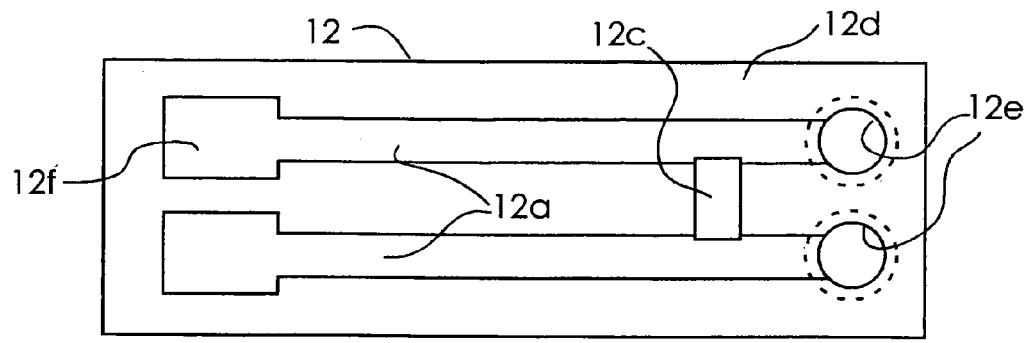
FIG. 3 is a plan view of the flexible substrate according to an embodiment of the present invention observed from the front face thereof.
Figure 4:
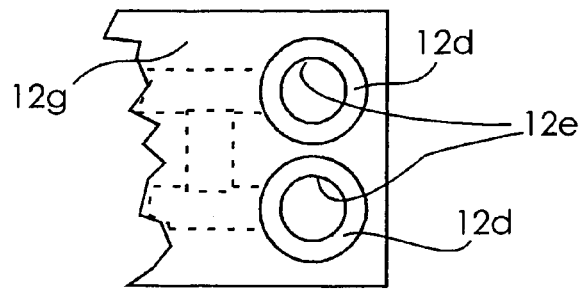
FIG. 4 is a partial plan view of the flexible substrate according to the embodiment of the present invention observed from the back face thereof.
Figure 5:
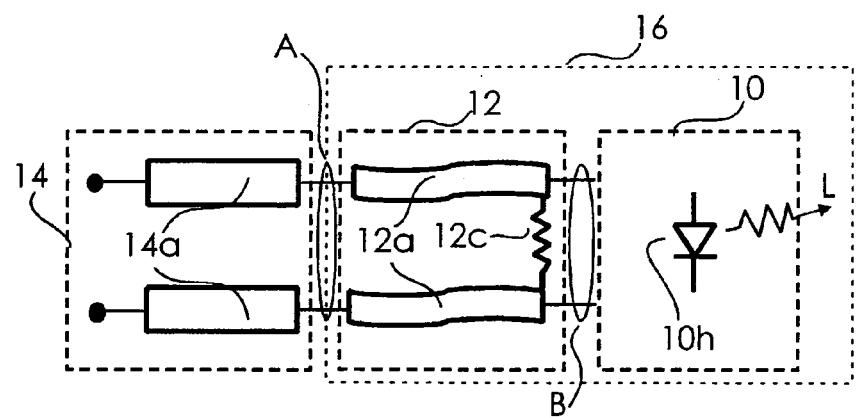
FIG. 5 is an equivalent circuit diagram of the optical semiconductor device shown in FIG. 1.

FIG. 1 is a perspective view of an optical semiconductor device according to an embodiment of the present invention; FIG. 2 is a perspective view showing the interior of a can package according to an embodiment of the present invention; FIG. 3 is a plan view of the flexible substrate according to an embodiment of the present invention observed from the front face thereof; FIG. 4 is a partial plan view of the flexible substrate according to the embodiment of the present invention observed from the back face thereof; and FIG. 5 is an equivalent circuit diagram of the optical semiconductor device shown in FIG. 1. In the drawings to be referred to below, like reference numerals will denote like or equivalent components.

Referring to FIG. 1, a can package 10 serving as an optical semiconductor package is sealed by a cap 10b that protects elements, such as a laser diode, mounted on a stem 10a serving as a substrate. Lead terminals 10c serving as electrode terminals for connecting an interior portion of the cap 10b with a back surface, which is an exterior portion of the stem 10a, are secured to the stem 10a.

A flexible substrate 12 is attached to the lead terminals 10c of the can package 10, and transmission lines 12a of the flexible substrate 12 and the lead terminals 10c are electrically connected by solders 12b. A resistor 12c serving as an impedance matching means is provided between the transmission lines 12a of the flexible substrate 12 at a position near a connection area of the transmission lines 12a and the lead terminals 10c.

The transmission lines 12a of the flexible substrate 12 are connected by soldering to a circuit board transmission lines 14a of a circuit board 14, on which a drive circuit (not shown in FIG. 1) for driving the can package 10 is mounted, at the ends thereof, which are not the ends connected to the lead terminals 10c. An arrow shown in FIG. 1 and other figures referred to below indicates a laser beam L. A metal film 12g is provided on the back surface of the flexible substrate 12.

FIG. 2 shows the can package 10 with the cap 10b removed. The can package 10 shown here is just one example having the two lead terminals 10c; however, there are cases where more lead terminals 10c are provided.

The stem 10a is formed of a metal disc, e.g., an iron disc having a diameter of about 3 mm to about 10 mm, and has a few through holes 10d into which the lead terminals 10c are inserted, the number of the through holes 10d depending on the number of the lead terminals 10c. The lead terminals 10c are secured to the stem 10a by glass hermetic sealants 10e. The hermetic sealants 10e also seal the gaps between the through holes 10d and the lead terminals 10c.

The lead terminals 10c, which are cut to be shorter than a standard projecting length, jut out from the back surface of the stem 10a. However, if the stem 10a and the lead terminals 10c may be electrically conductive, then the lead terminals 10c will be secured to the stem 10a by welding. In this case, therefore, the number of the through holes 10d will be less than the number of the lead terminals 10c.

A mount 10f is secured by an adhesive agent to the front surface of the stem 10a. In addition, a sub-mount 10g is secured on the mount 10f by an adhesive agent, and a laser diode 10h is secured to the sub-mount 10g by an adhesive agent.

High-frequency RF signals are supplied to the laser diode 10h connected to the lead terminals 10c on the surface side of the stem 10a by wires 10i.

The protuberant portions of the lead terminals 10c which are located on the front surface side of the stem 10a, the wires 10i, the mount 10f, the sub-mount 10g, and the laser diode 10h, are covered by the metallic cap 10b. The cap 10b and the surface of the stem 10a are hermetically sealed.

The top portion of the cap 10b is provided with a glass window (not shown), and laser beams are emitted through the window.

The flexible substrate 12 shown in FIG. 3 has transmission lines 12a serving as signal transmission lines laid on the surface of a polyimide film 12d serving as a dielectric film. The polyimide film 12d measures about 10 mm long and about 5 mm wide. The transmission lines 12a formed of, for example, two Cu thin films have a characteristic impedance of 50 Ω, and are formed to be parallel to the polyimide film 12d in the lengthwise direction.

The flexible substrate 12 has through holes 12e formed at one ends of the transmission lines 12a. The lead terminals 10c of the can package 10 are inserted into the through holes 12e, and then the lead terminals 10c and the transmission lines 12a are electrically connected by solders 12b.

The resistor 12c made of a thin film of, for example, a tungsten nickel alloy, is provided in the vicinity of the through holes 12e provided at one ends of the transmission lines 12a. The resistor 12c is formed on the polyimide film 12d and shunt-connected between the two transmission lines. The resistor 12c is one of the impedance matching means for matching the impedance of the transmission lines 12a near the through holes 12e of the flexible substrate 12 with the impedance of the lead terminals 10c on the back surface side of the stem 10a that are inserted into the through holes 12e.

In order to restrain deterioration of a frequency response band of the laser diode 10h, a resistance value R of the resistor 12c provided in parallel with the transmission lines 12a is preferably set so as not to be excessively smaller than the impedance Zin (normally 50 Ω) of the transmission lines 12a and a maximum value Zmax of the impedance of the lead terminals 10c on the back surface side of the stem 10a of the can package 10 at high frequencies.

On the other hand, if the resistance value R of the resistor 12c is set to be larger than the impedance Zin or the maximum value Zmax of the impedance of the lead terminals 10c by an order of magnitude or more, then the improvement effect of reflection characteristic S11 will be less.

In general, the impedance Zin of the transmission lines 12a ranges from 25 Ω to 100 Ω, and the maximum value Zmax of the impedance of the lead terminals 10c ranges from 50 Ω to 150 Ω. Hence, good reflection characteristic S11 and the transmission characteristic S21 can be obtained when the resistance value R of the resistor 12c ranges from 25 Ω to 1500 Ω (Zin<=R<=10 Zmax when generalized on the basis of R), or more preferably, when the resistance value R of the resistor 12c ranges from 100 Ω to 600 Ω (2Zin<=R<(2 to 4)Zmax) when generalized on the basis of R).

At the opposite ends of the transmission lines 12a from the ends where the through holes 12e are provided, lands 12f are provided as connection areas to which circuit board transmission lines 14a of the circuit board 14 are connected when the flexible substrate 12 is connected to the circuit board 14. To connect the flexible substrate 12 to the circuit board 14, the lands 12f and the circuit board transmission lines 14a are electrically connected using solder.

Referring to FIG. 4, the entire surfaces of the polyimide films 12d on the back surface of the flexible substrate 12 are provided with the metal film 12g so as to be grounded. In order to prevent the solders 12b and the metal film 12g from short-circuiting when the lead terminals 10c and the transmission lines 12a are connected by the solders 12b, the metal film 12g is absent in a concentric shape around the through holes 12e, exposing the polyimide films 12d.

The grounding metal film 12g provided on the back surface of the flexible substrate 12 is not necessarily required if drive is performed by a differential produced when high-frequency signals of positive phase and negative phase are supplied to the laser diode 10h through the two lead terminals 10c.

More specifically, if the laser diode 10h is driven differentially, then the anode and the cathode of the laser diode 10h are usually connected respectively to the individual transmission lines 12a, and neither the anode nor the cathode of the laser diode 10h is in electrical connection with the stem 10a of the can package 10.

If high-frequency signals are supplied between only one of the transmission lines 12a and the metal film 12g, then the metal film 12g provided on the back surface of the flexible substrate 12 is required.

The lead terminals 10c shown in FIG. 1 and FIG. 2 project from the back surface of the stem 10a. In some cases, however, the lead terminals 10c may be merely exposed on the back surface of the stem 10a rather than jutting out of the back surface of the stem 10a. In such cases, the through holes 12e of the flexible substrate 12 are no longer necessary. The lead terminals 10c and the transmission lines 12a of the flexible substrate 12 are brought into direct contact and connected by thermo compression bonding or soldering.

As shown in the equivalent circuit diagram related to a laser device 16 shown in FIG. 5, the laser device 16 according to the first embodiment is constructed of the can package 10 and the flexible substrate 12 connected to the can package 10.

Referring to the equivalent circuit diagram, point A indicates a connection area of the circuit board 14 and the flexible substrate 12, while point B indicates a connection area of the flexible substrate 12 and the lead terminals 10c on the outer side of the stem 10a of the can package 10.

The description will now be given of the operation of the laser device 16.

As shown in FIG. 5, a high-frequency signal of, for example, about 1V, for directly modulating the laser diode 10h is propagated to the transmission lines 12a of the flexible substrate 12 via connection area A from a drive circuit (not shown) for driving the can package 10 provided on the circuit board 14. In the laser device 16, square-wave high-frequency signals having positive/negative phases are applied to the two transmission lines 12a to drive the laser based on differentials. The high-frequency signals are propagated to the lead terminals 10c of the can package 10 via connection area B, and a voltage is applied between the anode and the cathode of the laser diode 10h through the wires 10i, causing the laser to emit light according to the high-frequency signals.

The high-frequency signals reflect in connection area A of the circuit board 14 and the flexible substrate 12 or connection area B of the flexible substrate 12 and the can package 10. The reflection in connection area A is not very high, because the impedance of the transmission lines 14a of the circuit board 14 and the impedance of the transmission lines 12a of the flexible substrate 12 are relatively close to each other.

However, in connection area B, a value of the impedance of the transmission lines 12a of the flexible substrate 12 is close to that of the characteristic impedance, while a value of the impedance of the lead terminals 10c of the can package 10 is small since they are secured to the stem 10a through the intermediary of the glass hermetic sealants 10e. Moreover, the total impedance of the can package 10, which is composed primarily of the resistance of the laser diode 10h, the capacity of the stem 10a, and the inductance of the lead terminals 10c, intricately changes according to frequencies. Hence, in connection area B, the impedance is not matched, causing high reflection of the high-frequency signals.

The laser device 16, however, has the resistor 12c connected in parallel to the transmission lines 12a at near the through holes 12e. The lead terminals 10c are inserted in the through holes 12e provided in a portion of the flexible substrate 12 that is near connection area B. This matches the impedance of the transmission lines 12a in connection area B and the impedance of the lead terminals 10c on the outer side of the can package 10, resulting in reduced reflection.

Since the reflection of high-frequency signals is reduced, the interference of high frequencies caused by the flexible substrate working as a resonator due to the reflection of high frequencies is restrained. As a result, surges having pitches of a few GHz that develop in the frequency characteristics of the transmission characteristic S21 and the reflection characteristic S11 become smaller, leading to less distortion in the waveforms of high-frequency signals propagating the flexible substrate, the distortion being attributable to the surges. This in turn restrains the distortion of the waveforms of modulation signals of laser oscillation, so that the laser device 16 exhibits good high-frequency characteristics.

Figure 6:
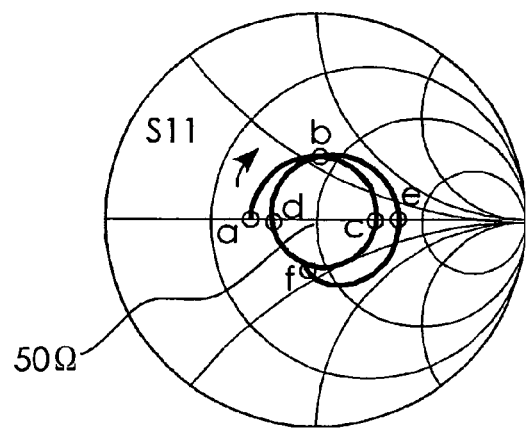
FIG. 6 shows a Smith chart of the reflection characteristic S11 of the can package according to the present invention.
Figure 7:
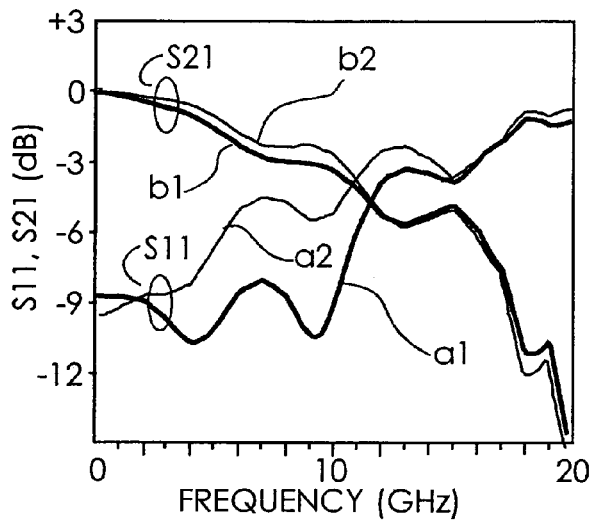
FIG. 7 is a graph showing the calculation results of the frequency characteristics of reflection characteristic S11 and the transmission characteristic S21 of the laser device according to the present invention.

FIG. 6 shows a Smith chart of the reflection characteristic S11 of the can package according to the present invention. FIG. 7 is a graph showing the calculation results of the frequency characteristics of reflection characteristic S11 and the transmission characteristic S21 of the laser device according to the present invention.

Referring to FIG. 6, when the frequency is changed from 10 MHz to 20 MHz, the impedance of the can package 10 changes from point a to point b, point c, point d, point b, point e, and point f in order, drawing a circle around 50 Ω, which is the center of the Smith chart. Point a indicates the impedance at 10 MHz, point c indicates the impedance at 7 GHz, point d indicates the impedance at 12 to 13 GHz, and point f indicates the impedance at 20 GHz. The impedance is high, 75 Ω, at around 7 GHz, and reflection characteristic S11 deteriorates at this frequency. Therefore, as in the case of the laser device 16 according to the present embodiment, the reflection at high frequencies will be reduced by restraining the impedance from increasing by inserting the resistor 12c in parallel between the transmission lines 12a near connection area B wherein the can package 10 and the flexible substrate 12 are connected.

FIG. 7 illustrates the frequency characteristics of reflection characteristic S11 and transmission characteristic S21 when the resistance value of the resistor 12c is set to 250 Ω in, for example, a case where the characteristic impedance of the transmission lines of the flexible substrate 12 is set to 50 Ω, and if drive is performed by a differential produced when high-frequency signals of positive phase and negative phase are supplied to the laser diode 10h through the two lead terminals 10c.

Referring to FIG. 7, reflection characteristic S11 of the laser device 16 according to the first embodiment is indicated by a curve a1 and transmission characteristic S21 thereof is indicated by a curve b1. For the purpose of comparison, reflection characteristic S11 of a laser device having a conventional construction, that is, a laser device without the resistor 12c, is indicated by a curve a2, while transmission characteristic S21 thereof is indicated by b2.

Considering that the laser device 16 is used at 10-Gbps modulation speed, the following will discuss a case involving frequencies of 10 GHz or less.

The S11 (the curve a2) of the conventional construction deteriorates to about −4.5 dB at 7 GHz, whereas reflection characteristic S11 (the curve a1) of the laser device 16 equipped with the resistor 12c shows an improvement of 3 dB in the vicinity of 7 GHz. Furthermore, the rise of the curve b1 showing transmission characteristic S21 of the laser device 16 at 9 GHz is smaller than the rise of the curve b2 showing transmission characteristic S21 of the laser device having the conventional construction, indicating an improvement. The improvement results in a smoother attenuation curve of the curve b1 of S21 in a frequency range of 10 GHz or less, as compared with the curve b2.

Figure 8:
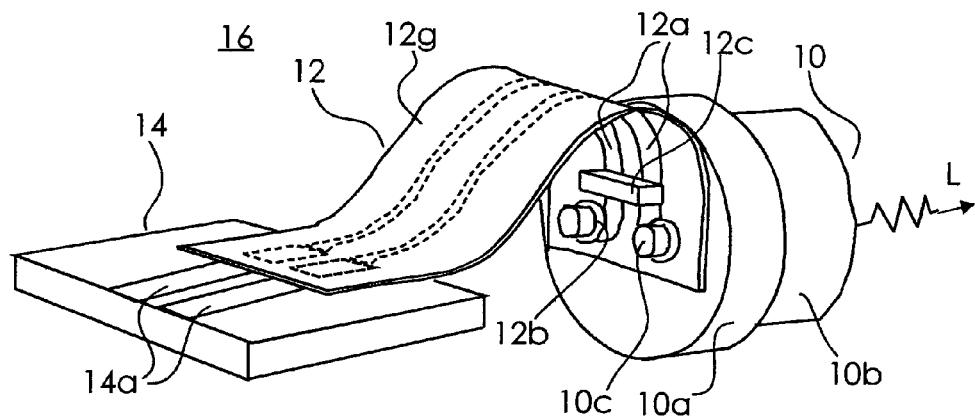
FIG. 8 is a perspective view of an optical semiconductor device according to a modification of one embodiment of the present invention.

FIG. 8 is a perspective view of an optical semiconductor device according to a modification of one embodiment of the present invention.

FIG. 1 shows the example of the laser device in which the resistor 12c formed of a tungsten-nickel alloy thin film is formed on the polyimide film 12d of the flexible substrate 12. The optical semiconductor device shown in FIG. 8 has a chip resistor 12c provided between transmission lines 12a, the chip resistor 12c providing the same advantages as those of the resistor 12c formed of the thin film.

Figure 9:
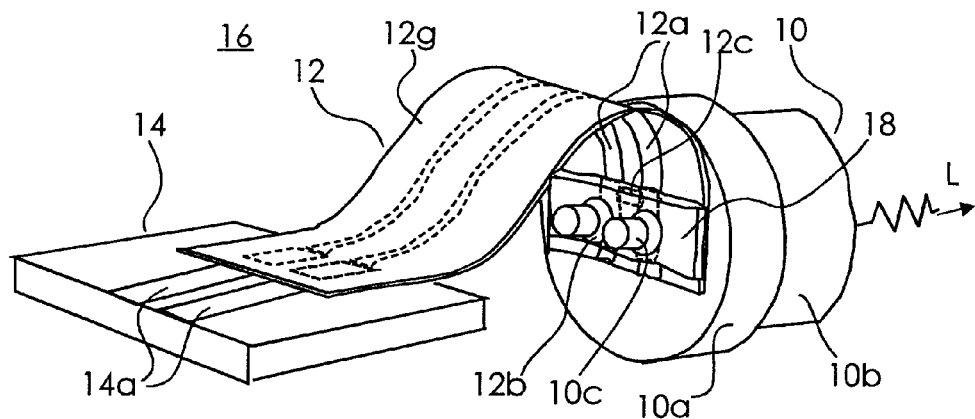
FIG. 9 is a perspective view of an optical semiconductor device according to another modification of one embodiment of the present invention.
Figure 10:
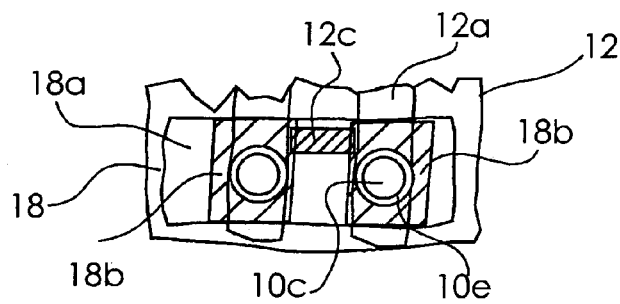
FIG. 10 is a partial perspective plan view showing the details of a part of the modification shown in FIG. 9.

FIG. 9 is a perspective view of an optical semiconductor device according to another modification of one embodiment of the present invention. FIG. 10 is a partial perspective plan view showing the details of a part of the modification shown in FIG. 9.

As shown in FIG. 9, a resistor 12c may be added by using a resistor connecting component 18 if it is difficult to directly connect the resistor to a flexible substrate 12.

Referring to FIG. 10, the resistor connecting component 18 has connection lines 18b provided on an insulating plate 18a formed of epoxy or the like, and the thin-film resistor 12c is connected in parallel between the connection lines 18b. Through holes into which lead terminals 10c are inserted are provided in the connection lines 18b, and through holes 12e of the transmission lines 12a of the flexible substrate 12 are fitted to the lead terminals 10c. The resistor connecting component 18 is attached to the lead terminals 10c via the through holes in the resistor connecting component 18 from above the transmission lines 12a of the flexible substrate 12 to bring the connection lines 18b in contact with the transmission lines 12a of the flexible substrate 12, and then the lead terminals 10c, the transmission lines 12a, and the connection lines 18b are connected by soldering. Thus, the thin-film resistor 12c is provided in the vicinity of connection area B wherein the lead terminals 10c and the transmission lines 12a are connected.

FIG. 10 shows the insulating plate 18a in the perspective manner to make visible the connection lines 18b disposed on the back surface of the insulating plate 18a and the thin-film resistor 12c. The connection lines 18b and the thin-film resistor 12c are hatched not to indicate the sections thereof but to explicitly show the connection lines 18b and the thin-film resistor 12c.

The construction described above makes it possible to dispose the thin-film resistor 12c in the vicinity of the connection area of the lead terminals 10c and the transmission lines 12a by the simple construction even if a conventional component is used as the flexible substrate 12, thus permitting the high-frequency characteristics of the laser device 16 to be improved.

Figure 11:
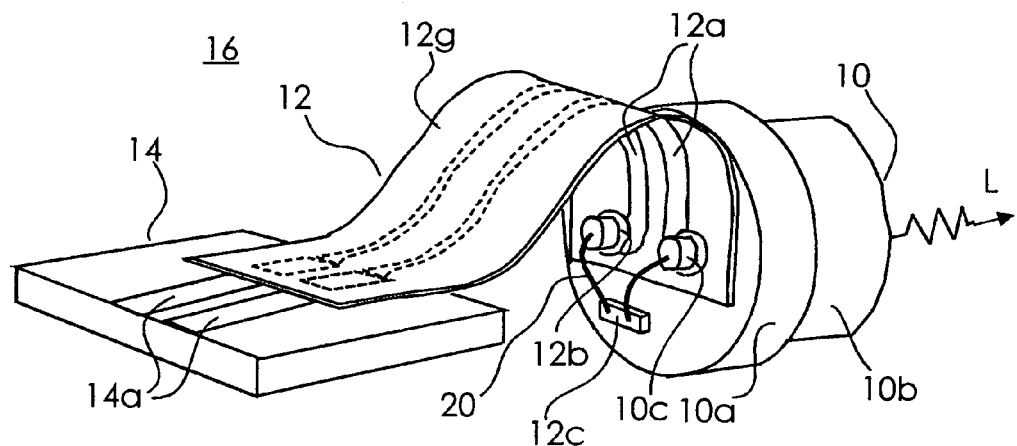
FIG. 11 is a perspective view of an optical semiconductor device according to another modification of the embodiment of the present invention.
Figure 12:
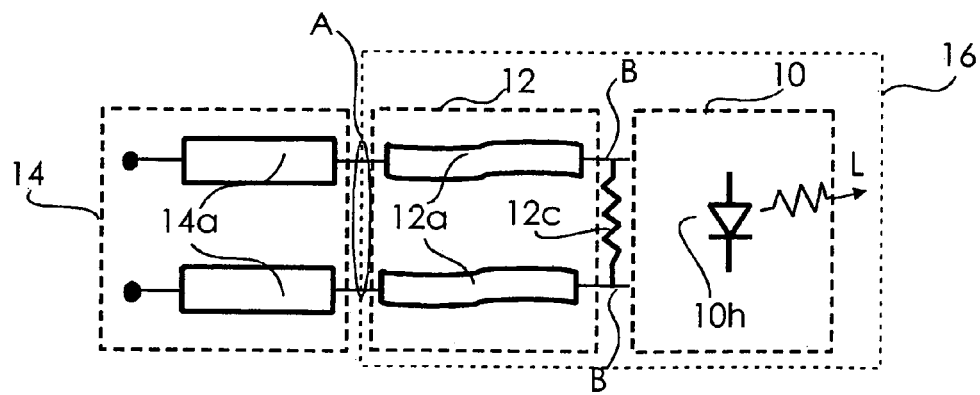
FIG. 12 is an equivalent circuit diagram of the optical semiconductor device shown in FIG. 11.

FIG. 11 is a perspective view of an optical semiconductor device according to another modification of the embodiment of the present invention. FIG. 12 is an equivalent circuit diagram of the optical semiconductor device shown in FIG. 11.

In the above description, the resistor 12c has been disposed on the flexible substrate 12; however, the resistor 12c may be mounted on the can package 10 or the like as long as it is near the connection area of the flexible substrate 12 and the lead terminals 10c of the can package 10. Referring to FIG. 11, the chip resistor 12c is provided on the can package 10 through wires 20. This construction also provides the same advantage obtained in the case where the resistor 12c is disposed on the flexible substrate 12.

Figure 13:
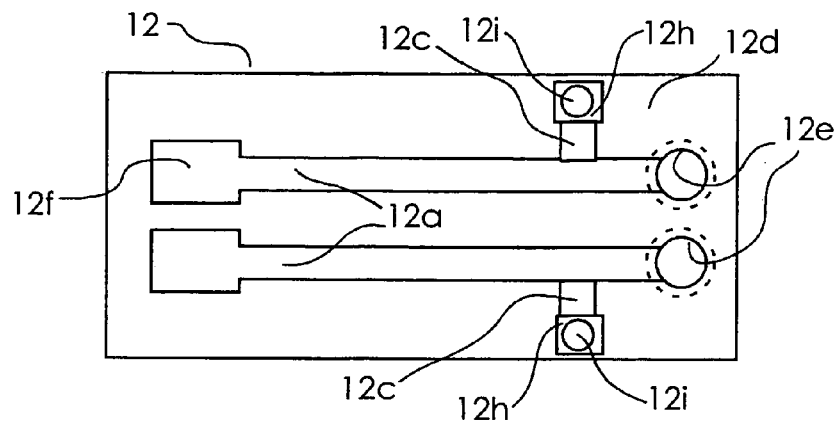
FIG. 13 is a plan view showing a modification of the flexible substrate of the optical semiconductor device according to the embodiment of the present invention.
Figure 14:
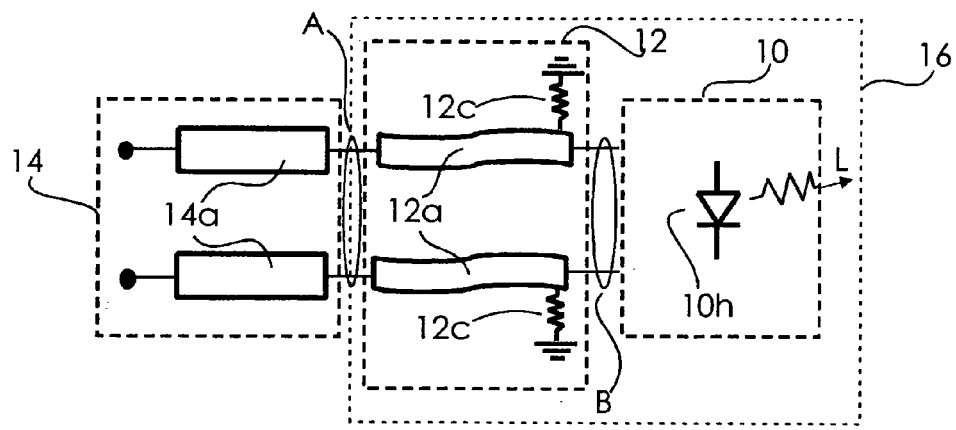
FIG. 14 is an equivalent circuit diagram of the optical semiconductor device using the flexible substrate shown in FIG. 13.

FIG. 13 is a plan view showing a modification of the flexible substrate of the optical semiconductor device according to the embodiment of the present invention. FIG. 14 is an equivalent circuit diagram of the optical semiconductor device using the flexible substrate shown in FIG. 13.

In a flexible substrate 12 shown in FIG. 13, thin-film resistors 12c having one ends thereof separately connected to transmission lines 12a at near through holes 12e are disposed on a polyimide film 12d. Islands 12h connected to the other ends of the thin-film resistors 12c are also formed on the polyimide film 12d, and the thin-film resistors 12c are connected, through via-holes 12i provided in the islands 12h, to a metal film 12g provided on the back surface of the polyimide film 12d so as to be grounded.

As an example of a laser device 16 having the construction illustrated by the equivalent circuit diagram of FIG. 14, chip resistors 12c may be used in place of the thin-film resistors 12c, and one ends of the chip resistors 12c may be separately connected to the transmission lines 12a at near the through holes 12e, while the other ends of the chip resistors 12c are connected to the islands 12h so as to be connected, through the via-holes 12i provided in the islands 12h, to a metal film 12g provided on the back surface of the polyimide film 12d.

The flexible substrate 12 and the laser device 16 shown in FIG. 13 and FIG. 14, respectively, use the metal film 12g provided on the back surface of the polyimide film 12d as a ground end. Alternatively, however, the stem 10a of the can package 10 may be used as a grounding end.

As described above, in the laser device according to the first embodiment, the resistor is connected in parallel between the transmission lines 12a near the through holes 12e of the flexible substrate 12 in connection area B of the can package 10 and the flexible substrate 12. This arrangement matches the impedance of the transmission lines 12a in the connection area B and the impedance of the lead terminals 10c on the outer side of the can package 10. As a result, the reflection of high-frequency signals is reduced and the interference of high frequencies caused by the flexible substrate 12 acting as a resonator is restrained, leading to less distortion in the waveforms of high-frequency signals propagating the flexible substrate 12. This in turn restrains the distortion of the waveforms of modulation signals of laser oscillation, making it possible to configure a laser device that exhibits good high-frequency characteristics.

Second Embodiment

Figure 15:
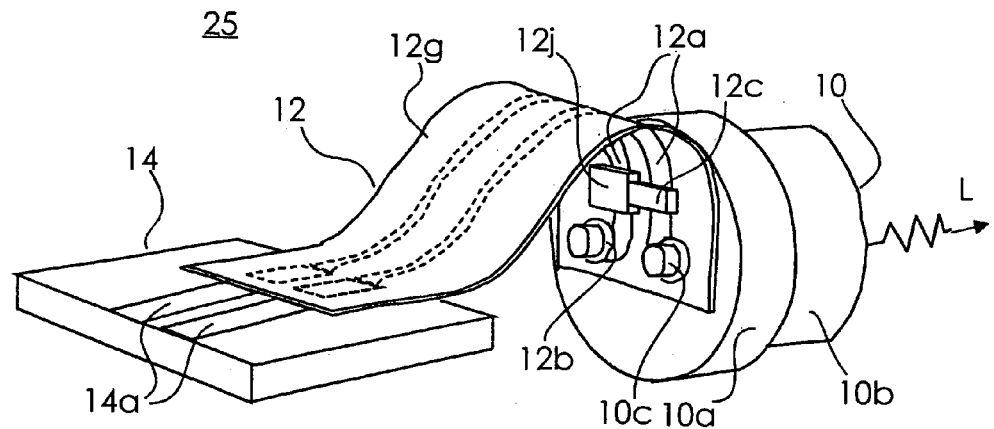
FIG. 15 is a perspective view of an optical semiconductor device according to one embodiment of the present invention.
Figure 16:
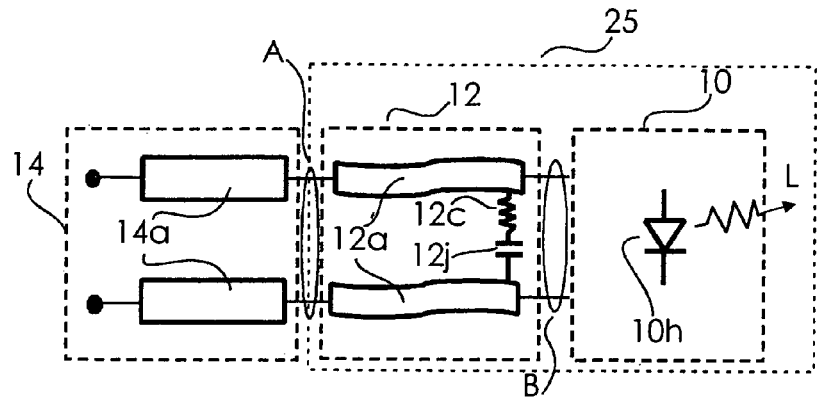
FIG. 16 is an equivalent circuit diagram of the optical semiconductor device shown in FIG. 15.

FIG. 15 is a perspective view of an optical semiconductor device according to one embodiment of the present invention. FIG. 16 is an equivalent circuit diagram of the optical semiconductor device shown in FIG. 15.

The first embodiment has referred to the example wherein the resistor 12c working as the impedance matching means is connected near the connection area B wherein the flexible substrate 12 and the lead terminals 10c of the can package 10 are connected.

A laser device 25 according to the second embodiment has the same construction as that according to the first embodiment except that a capacitor 12j is provided in addition to a resistor 12c, the capacitor 12j being connected in series with the resistor 12c. The resistor 12c and the capacitor 12j constitute the impedance matching means. In this case, the resistor 12c is, for example, a chip resistor, and the capacitor 12j is, for example, a chip capacitor.

A bias voltage of about a threshold value is applied to a laser diode 10h. In association with the bias voltage, a DC bias current and a high-frequency signal current (modulation current) simultaneously pass through transmission lines 12a of a flexible substrate 12. If the capacitor 12j is connected in series with the resistor 12c, a DC component of current does not pass through the resistor 12c because of the presence of the capacitor 12j, whereas an AC component of a high-frequency signal of about 7 GHz, in which the impedance of the can package 10 increases, passes through the resistor 12c.

The above arrangement makes it possible to prevent the DC component from being wastefully consumed by the resistor 12c. Moreover, the AC component of the high frequency is shunted to the resistor 12c, thus making it possible to restrain the reflection of AC components of high-frequencies in the connection area of the can package 10 and the flexible substrate 12 attributable to higher frequencies in which impedances of the can package raises. This allows a highly efficient laser device with good modulation characteristics to be achieved.

Figure 17:
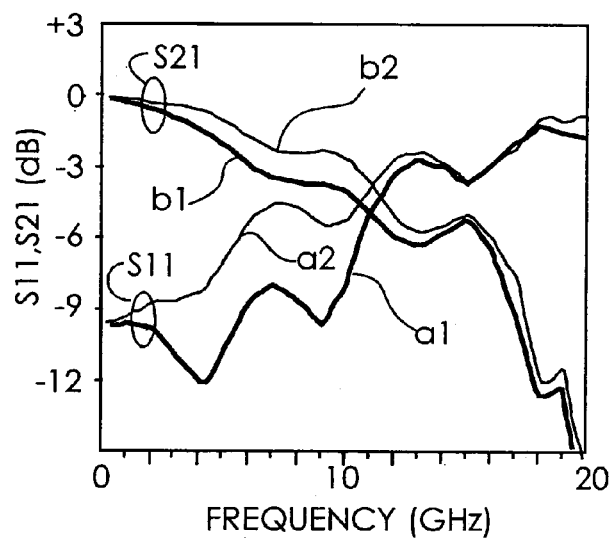
FIG. 17 is a graph illustrating calculation results of the frequency characteristics of reflection characteristic S11 and transmission characteristic S21 of a laser device according to the present invention.

FIG. 17 is a graph illustrating calculation results of the frequency characteristics of reflection characteristic S11 and transmission characteristic S21 of a laser device according to the present invention.

FIG. 17 shows the results of calculation performed with the resistance value of the resistor 12c set at 250 Ω and the capacitance of the capacitor 12j set at 2 pF, using the constructions shown in FIG. 15 and FIG. 16. In this calculation, the drive is performed by a differential produced when high-frequency signals of positive phase and negative phase are supplied to the laser diode 10h through the two lead terminals 10c, the impedance of the transmission lines 12a being 50 Ω, as in the case of the first embodiment.

Referring to the graph of FIG. 17, reflection characteristic S11 of the laser device 25 according to the second embodiment is indicated by a curve a1 and transmission characteristic S21 thereof is indicated by a curve b1. For the purpose of comparison, reflection characteristic S11 of a laser device having a conventional construction, that is, a laser device without the resistor 12c and the capacitor 12j is indicated by a curve a2, while transmission characteristic S21 thereof is indicated by b2.

The S11 (the curve a2) of the conventional construction deteriorates to about −4.5 dB at 7 GHz, whereas reflection characteristic S11 (the curve a1) of the laser device 25 equipped with the resistor 12c and the capacitor 12j shows an improvement of 3.5 dB in the vicinity of 7 GHz. Furthermore, the rise of the curve b1 showing transmission characteristic S21 of the laser device 25 at 9 GHz is smaller than the rise of the curve b2 showing transmission characteristic S21 of the laser device having the conventional construction, indicating an improvement.

Considering possible use at 10 Gbps, the capacitance of the capacitor 12j should be set to about 0.5 pF or more so as to be effective at high frequencies of about 10 GHz, it is preferably set to 1 pF or more. However, if the capacitance value thereof is too high, then a group delay occurs; therefore, the capacitance value is preferably set to be 5 pF or less for a construction having limited allowance for group delays.

Figure 18:
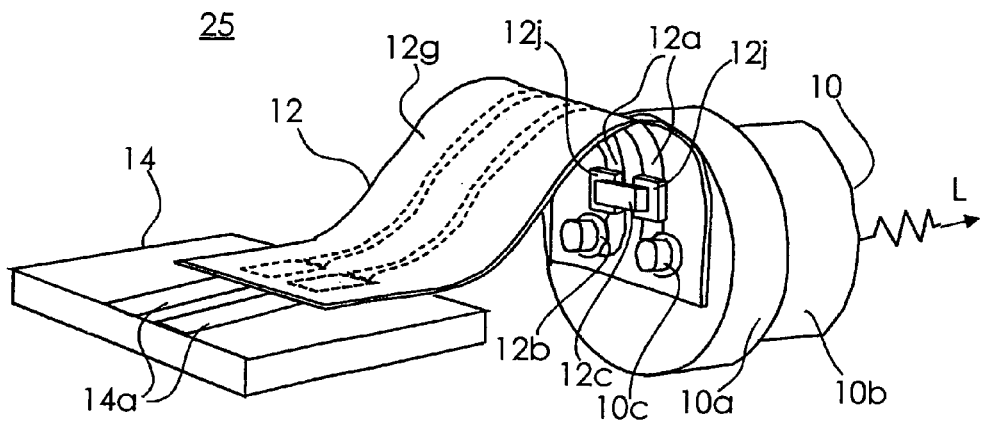
FIG. 18 is a perspective view of an optical semiconductor device according to a modification of one embodiment of the present invention.
Figure 19:
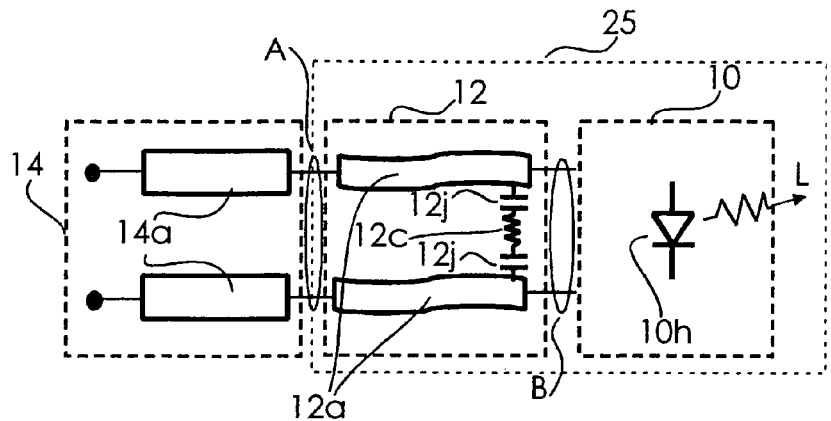
FIG. 19 is an equivalent circuit diagram of the optical semiconductor device shown in FIG. 18.

FIG. 18 is a perspective view of an optical semiconductor device according to a modification of one embodiment of the present invention. FIG. 19 is an equivalent circuit diagram of the optical semiconductor device shown in FIG. 18.

If a laser is driven by the differential produced by high-frequency signals of positive and negative phases supplied to the laser diode 10h, the two transmission lines to which the positive/negative-phase high-frequency signals are supplied are preferably electrically symmetrical with respect to the resistor 12c. The laser device 25 in the modification shown in FIG. 18 and FIG. 19 is identical to the laser device 25 according to the second embodiment in that the resistor 12c and the capacitors 12j connected in series to the resistor 12c are connected between the transmission lines 12a at near the through holes 12e of the flexible substrate 12 such that the resistor 12c and the capacitors 12j are in parallel to the transmission lines 12a. The laser device 25 of the present modification, however, differs in that the capacitors 12j are disposed symmetrically with respect to the resistor 12c.

In this case, the two capacitors are disposed in series, so that setting the value of the capacitors 12j to be double the value of the capacitor 12j in the second embodiment shown in FIG. 15 and FIG. 16 makes it possible to obtain good S11 and S21 characteristics shown in FIG. 17.

Alternatively, the capacitors 12j and the resistor 12c may be switched, and two resistors 12c may be symmetrically connected on both sides of the capacitor 12j. In this case, the good S11 and S21 characteristics shown in FIG. 17 can be obtained by setting the resistance value of the resistors 12c to be half the resistance value of the resistor 12c in the second embodiment shown in FIG. 15.

Thus, in the laser device 25 according to the second embodiment, the resistor 12c and the capacitor 12j connected in series to the resistor 12c are connected in parallel between the transmission lines 12a at near the through holes 12e of the flexible substrate 12 in connection area B of the can package 10 and the flexible substrate 12. This arrangement matches the impedance of the connection area B wherein the transmission lines 12a and the lead terminals 10c on the outer side of the can package 10 are connected. As a result, the reflection of high-frequency signals is reduced and the interference of high frequencies caused by the flexible substrate 12 acting as a resonator is restrained, leading to less distortion in the waveforms of high-frequency signals propagating the flexible substrate 12. Furthermore, the power consumed by the resistor 12c can be reduced. Thus, higher efficiency can be achieved and the distortion of the waveforms of modulation signals of laser oscillation can be reduced, making it possible to configure a laser device that exhibits good high-frequency characteristics.

Third Embodiment

Figure 20:
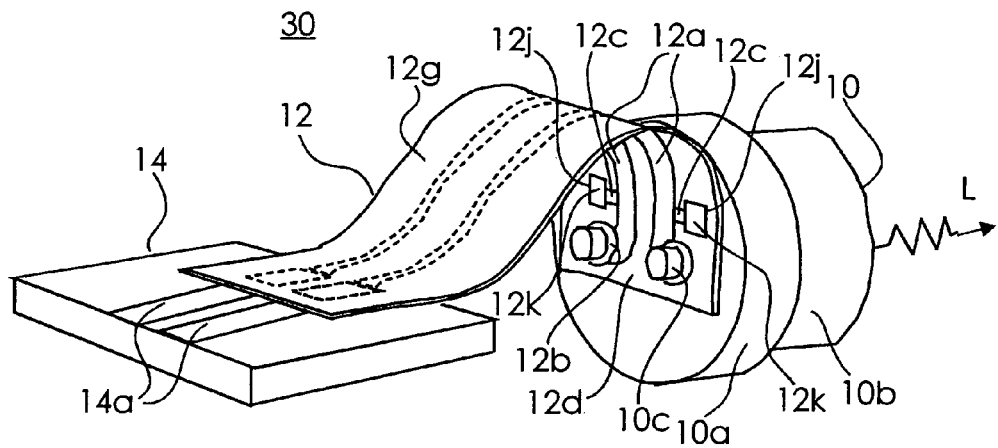
FIG. 20 is a perspective view of an optical semiconductor device according to one embodiment of the present invention.
Figure 21:
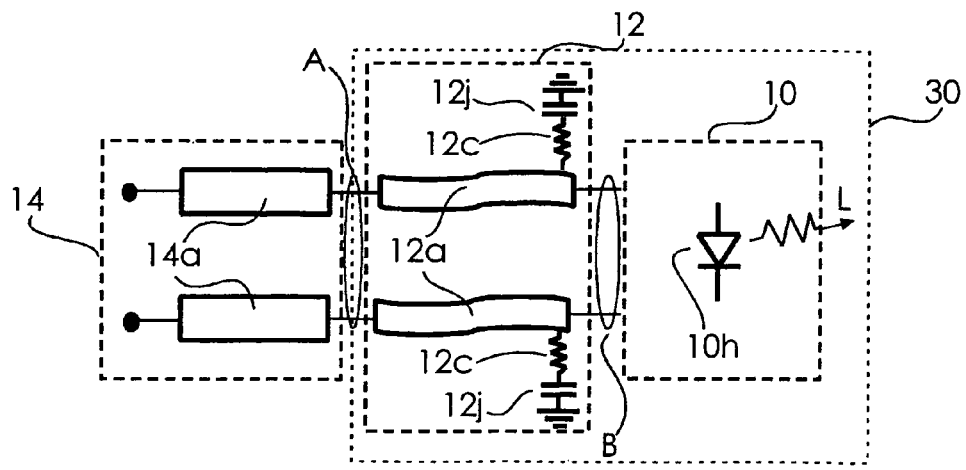
FIG. 21 is an equivalent circuit diagram of the optical semiconductor device shown in FIG. 20.

FIG. 20 is a perspective view of an optical semiconductor device according to one embodiment of the present invention. FIG. 21 is an equivalent circuit diagram of the optical semiconductor device shown in FIG. 20.

The second embodiment has shown a case where the transmission lines 12a are directly interconnected through the capacitor 12j and the resistor 12c connected in series. The construction of the third embodiment is the same as that of the second embodiment except that each transmission line is connected with a grounding end through the intermediary of a capacitor 12j and a resistor 12c connected in series.

Referring to FIG. 20, in a flexible substrate 12 of a laser device 30, thin-film resistors 12c having one ends thereof respectively connected to transmission lines 12a at near through holes 12e are disposed on a polyimide film 12d, and the other ends of the individual thin-film resistors 12c and islands 12k formed of conductive films that provide the electrodes on one side of capacitors 12j are respectively connected. The capacitors 12j are constructed of the islands 12k, the polyimide film 12d, and a metal film 12g provided on the back surface of the polyimide film 12d. The metal film 12g is grounded.

Also in the construction of the laser device 30 according to the third embodiment shown in FIG. 20 and FIG. 21, the resistor 12c and the capacitors 12j connected in series with the resistor 12c are connected in parallel between the transmission lines 12a and the grounding ends at near through holes 12e of the flexible substrate 12. The two transmission lines 12a to which the resistors 12c and the capacitors 12j are connected are provided such that they are electrically symmetrical through the intermediary of the grounding ends.

Hence, the laser device 30 according to the third embodiment provides the same advantage as that of the laser device 25, which is a modification of the second embodiment and has the construction shown in FIG. 18.

Figure 22:
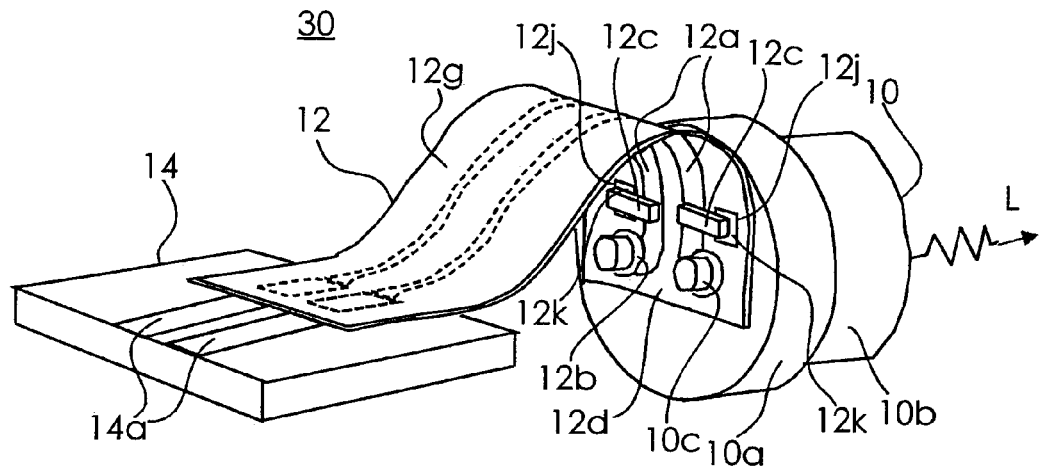
FIG. 22 is a perspective view of an optical semiconductor device according to a modification of one embodiment of the present invention.

FIG. 22 is a perspective view of an optical semiconductor device according to a modification of one embodiment of the present invention.

The laser device 30 according to the third embodiment shown in FIG. 20 uses, as the resistors 12c, thin-film resistors disposed on the polyimide film 12d of the flexible substrate 12. A laser device 30 according to a modification shown in FIG. 22 uses chip resistors in place of the thin-film resistors as the resistors 12c. The laser device 30 according to this modification also provides the same advantage as that of the laser device according to the third embodiment shown in FIG. 20.

Figure 23:
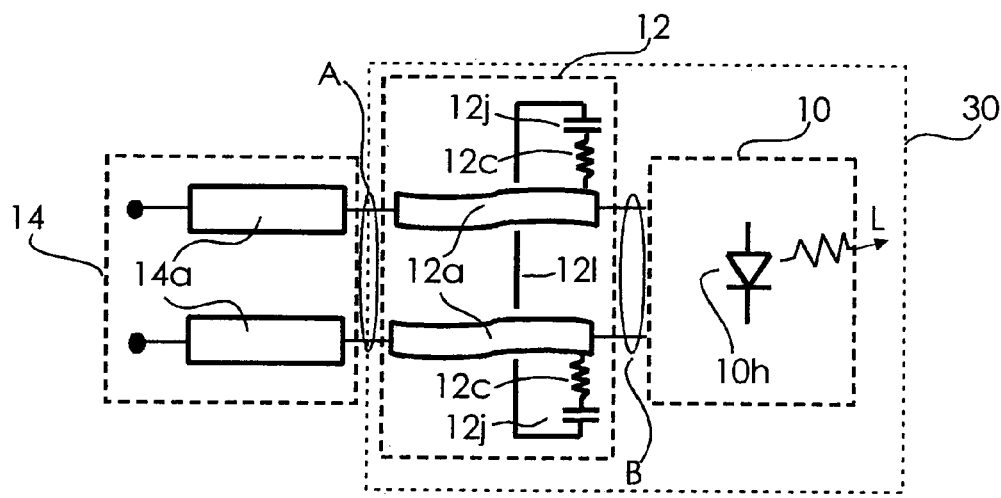
FIG. 23 is an equivalent circuit diagram of an optical semiconductor device according to a modification of the embodiment of the present invention.

FIG. 23 is an equivalent circuit diagram of an optical semiconductor device according to a modification of the embodiment of the present invention.

As shown in the equivalent circuit diagram of FIG. 21, the laser device 30 is connected to a circuit board through the grounding ends. In the laser device 30 shown in the equivalent circuit diagram of FIG. 23, two transmission lines 12a are connected through another circuit wire 121, the two transmission lines 12a being disposed such that they are electrically symmetrical with respect to the circuit wire 121. Thus, this laser device 30 provides the same advantage as that of the laser device 25 having the construction shown in FIG. 18, which is the modification of the second embodiment.

Fourth Embodiment

Figure 24:
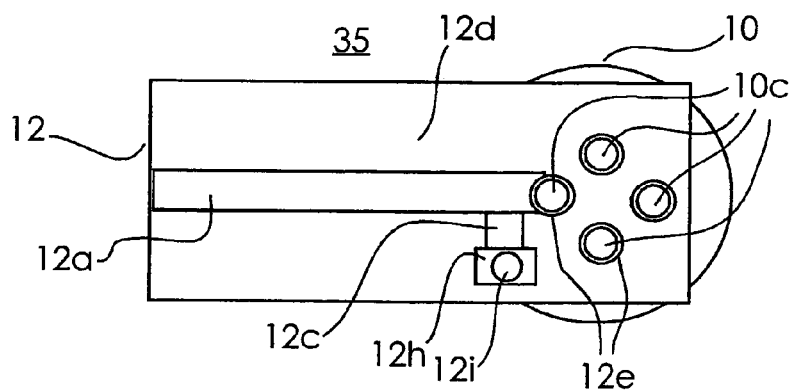
FIG. 24 is a plan view of an optical semiconductor device according to a fourth embodiment of the present invention.
Figure 25:
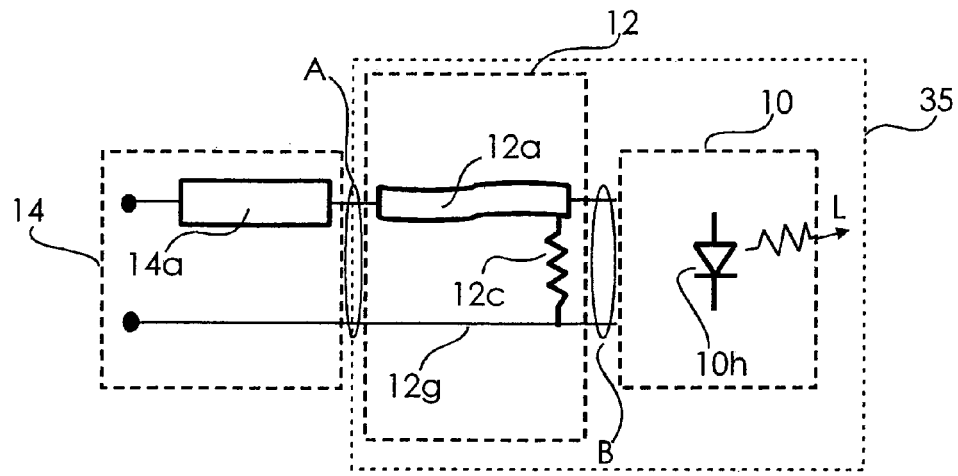
FIG. 25 is an equivalent circuit diagram of an optical semiconductor device shown in FIG. 24.

FIG. 24 is a plan view of an optical semiconductor device according to a fourth embodiment of the present invention. FIG. 25 is an equivalent circuit diagram of an optical semiconductor device shown in FIG. 24.

The fourth embodiment is used when a laser diode 10h of a can package 10 is driven by using a single transmission line 12a to propagate high-frequency modulation signals, as in the case of a single-phase drive. In the embodiment, the single transmission line 12a provided on the front surface of a polyimide film 12d of a flexible substrate 12 and a metal film 12g provided on the back surface of the polyimide film 12d are used as signal feeder line of high-frequency signals, and an impedance matching means is shunt-connected between the transmission line 12a and the metal film 12g.

The single-phase drive here comes in two types. In both cases, one of the electrodes, namely, the anode and the cathode, of a laser diode 10h is connected to one transmission line 12a of the flexible substrate 12, and the other electrode of the laser diode 10h that is not connected to the transmission line 12a is connected to a metal film 12g. In one type, the electrode of the laser diode 10h that is connected to the metal film 12g is not connected to a stem 10a of the can package 10. In the other type, the electrode of the laser diode 10h that is connected to the metal film 12g is connected to the stem 10a of the can package 10. Accordingly, in both types of the single-phase drive, the transmission line 12a and the metal film 12g are necessary.

Referring to FIG. 24, in a laser device 35 having the flexible substrate 12 and the can package 10, through holes 12e are formed at one end of the transmission line 12a of the flexible substrate 12, lead terminals 10c of the can package 10 are inserted in the through holes 12e, and the lead terminals 10c and the transmission line 12a are electrically connected by solders.

The metal film 12g is provided on the entire surface of the polyimide film 12d on the back surface side of the flexible substrate 12. Another lead-terminal 10c that is different from the lead terminal 10c connected to the transmission line 12a is connected to the metal film 12g by soldering. The transmission lines 12a and the metal film 12g constitute signal feeders for driving the laser diode 10h.

As a resistor 12c serving as an impedance matching means disposed in the vicinity of connection area B wherein the flexible substrate 12 and the lead terminals 10c of the can package 10 are connected, a thin-film resistor 12c having one end thereof connected to the transmission line 12a is disposed on the polyimide film 12d at near the through holes 12e. An island 12h connected to the other end of the thin-film resistor 12c is formed on the polyimide film 12d, and the thin-film resistor 12c is connected to the metal film 12g provided on the back surface of the polyimide film 12d through a via-hole 12i provided in the island 12h.

In the laser device 35 for the single-phase drive or the like constructed as above, the resistor 12c is connected in parallel between the transmission line 12a and the metal film 12g at near the through holes 12e of the flexible substrate 12 at connection area B of the can package 10 and the flexible substrate 12. This arrangement matches the impedance of the transmission line 12a in connection area B and the impedance of the lead terminals 10c on the outer side of the can package 10. As a result, the reflection of high-frequency signals is reduced and the interference of high frequencies caused by the flexible substrate 12 acting as a resonator is restrained, leading to less distortion in the waveforms of high-frequency signals propagating the flexible substrate 12.

Thus, it is possible to construct a laser device that minimizes distortion of waveforms of modulation signals of laser oscillation, exhibiting good high-frequency characteristics for an application of single-phase drive.

Figure 26:
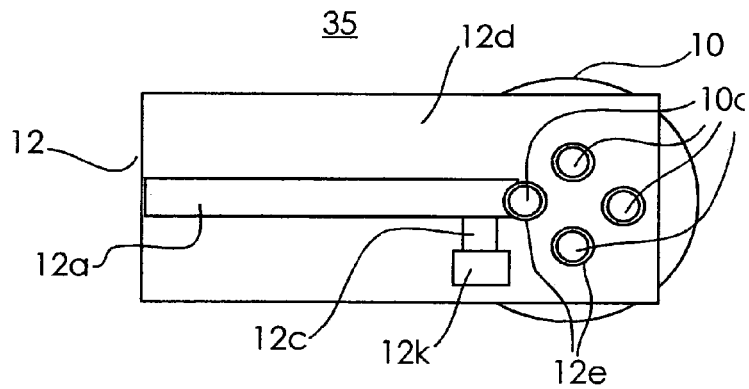
FIG. 26 is a plan view of an optical semiconductor device according to a modification of one embodiment of the present invention.
Figure 27:
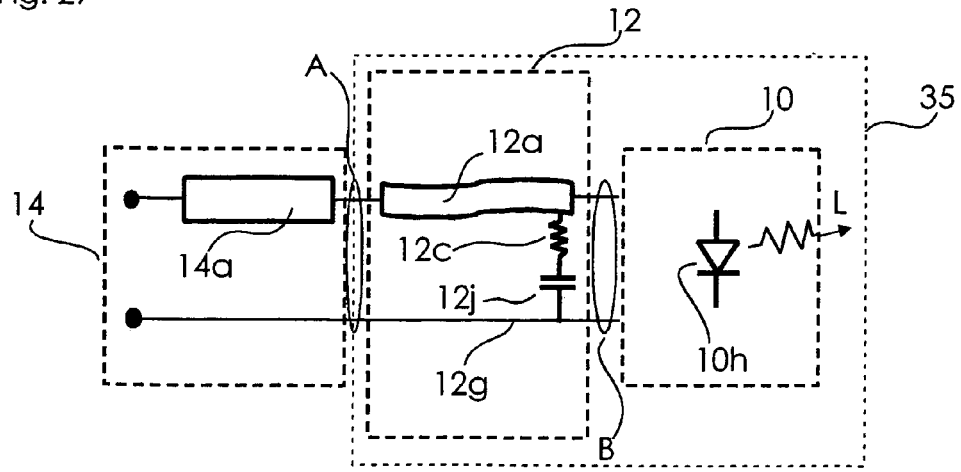
FIG. 27 is an equivalent circuit diagram of the optical semiconductor device shown in FIG. 26.

FIG. 26 is a plan view of an optical semiconductor device according to a modification of one embodiment of the present invention. FIG. 27 is an equivalent circuit diagram of the optical semiconductor device shown in FIG. 26.

A laser device 35 according to the modification shown in FIG. 26 differs from the laser device 35 shown in FIG. 24 in the following aspect. The thin-film resistor 12c provided in the laser device 35 shown in FIG. 24 is connected to the metal film 12g provided on the back surface of the polyimide film 12d through the via-hole 12i formed in the island 12h.

In a laser device 35 according to the modification shown in FIG. 26, a transmission line 12a is connected to a metal film 12g provided on the back surface of a polyimide film 12d through the intermediary of a resistor 12c and a capacitor 12j connected in series. The rest of this laser device 35 is identical to the construction of the laser device 35 according to the fourth embodiment shown in FIG. 24.

A flexible substrate 12 of the laser device 35 shown in FIG. 26 has a thin-film resistor 12c with its one end connected to the transmission line 12a is disposed on the polyimide film 12d at near through holes 12e, and the other end of the thin-film resistor 12c is connected to the island 12k formed of a conductive film functioning as one electrode of the capacitor 12j. The capacitor 12j is composed of the island 12k, the polyimide film 12d, and the metal film 12g provided on the back surface of the polyimide film 12d.

As in the case of the second embodiment, the laser device 35 according to the modification shown in FIG. 26 makes it possible to prevent DC components from being wastefully consumed by the resistor 12c, and to restrain the reflection in the connection area of the can package 10 and the flexible substrate 12 attributable to higher frequencies in which impedances of the can package 10 increases when the laser device 35 is used for single-phase drive or the like. Thus, the highly efficient laser device 35 with good modulation characteristics can be achieved.

As described above, the laser device according to the present embodiment is ideally used for single-phase drive or the like, since the resistor or a set of the resistor and the capacitor connected in series is connected in parallel between the transmission line 12a at near the through hole 12e of the flexible substrate 12 in connection area B of the can package 10 and the flexible substrate 12 and the metal film 12g provided on the back surface of the flexible substrate 12. This arrangement matches the impedance of the transmission line 12a in connection area B and the impedance of the lead terminals 10c on the outer side of the can package 10. As a result, the reflection of high-frequency signals is reduced and the interference of high frequencies caused by the flexible substrate 12 acting as a resonator is restrained, leading to less distortion in the waveforms of high-frequency signals propagating the flexible substrate 12. This in turn restrains the distortion of the waveforms of modulation signals of laser oscillation, making it possible to configure a laser device that exhibits good high-frequency characteristics ideally used for single-phase drive.

Fifth Embodiment

Figure 28:
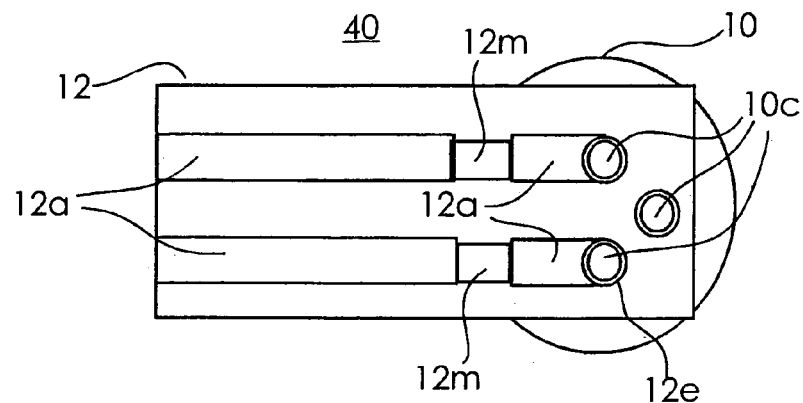
FIG. 28 is a plan view of an optical semiconductor device according to a fifth embodiment of the present invention.

FIG. 28 is a plan view of an optical semiconductor device according to a fifth embodiment of the present invention.

In the fifth embodiment, thin-film resistors 12m are connected to transmission lines 12a in series as if they were part of the transmission lines 12a provided on a flexible substrate 12. In the fifth embodiment, the description will be given of an example of the flexible substrate 12 when square-wave, high-frequency signals having positive/negative phases are applied to two transmission lines 12a to perform laser drive based on differentials. However, the present embodiment provides the same advantage also when it is applied to the flexible substrate 12 used in the case where the single transmission line 12a and the metal film 12g are used to propagate high-frequency modulation signals to drive the laser diode 10h of a can package 10, as in the case of the single-phase drive or the like explained in connection with the fourth embodiment.

Referring to the flexible substrate 12 and the can package 10 of a laser device 40 shown in FIG. 28, through holes 12e are formed at one ends of the transmission lines 12a of the flexible substrate 12, lead terminals 10c of the can package 10 are inserted in the through holes 12e, and the lead terminals 10c and the transmission lines 12a are electrically connected by solders.

Thin-film resistors 12m serving as first resistance elements are connected in series with the transmission lines 12a at near the through holes 12e of the flexible substrate 12 such that the thin-film resistors 12m look as if they were a part of the transmission lines 12a.

When high-frequency signals are propagated onto the flexible substrate 12, the high-frequency signals reflect in connection area B wherein the flexible substrate 12 and the can package 10 are connected.

In the laser device 40, however, the thin-film resistors 12m are connected in series with the transmission lines 12a at near the through holes 12e in which lead terminals 1c provided on the flexible substrate 12 and located near connection area B are inserted, so that even if the high-frequency signals reflect in connection area B, the thin-film resistors 12m connected in series with the transmission lines 12a attenuate the resonance of the high-frequency signals taking place due to the flexible substrate acting like a resonator. This arrangement restrains the resonance and the interference of high frequencies.

As a result, surges having pitches of a few GHz that develop in the frequency characteristics of the transmission characteristic S21 and the reflection characteristic S11 become smaller, leading to less distortion in the waveforms of high-frequency signals propagating the flexible substrate 12 because the distortion is attributable to the surges. This in turn restrains the distortion of the waveforms of modulation signals of laser oscillation, so that the laser device 16 exhibits good high-frequency characteristics.

Figure 29:
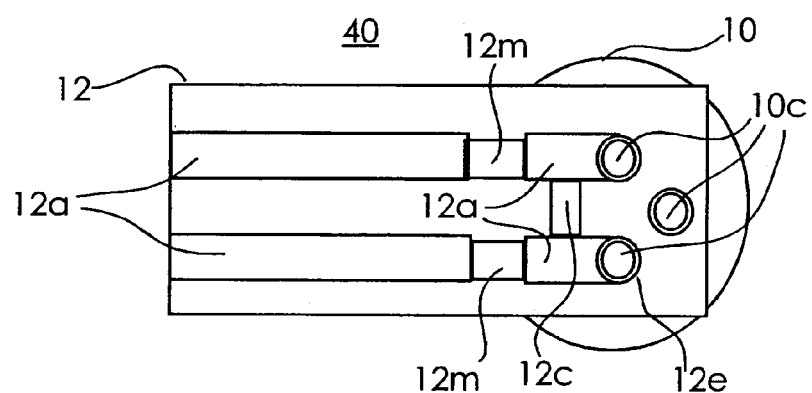
FIG. 29 is a plan view of an optical semiconductor device according to another modification of one embodiment of the present invention.

FIG. 29 is a plan view of an optical semiconductor device according to another modification of one embodiment of the present invention.

In the construction shown in FIG. 29, further a resistor 12c serving as a second resistance element is connected in parallel between the transmission lines 12a in addition to the thin-film resistors 12m connected in series with the transmission lines 12a.

Figure 30:
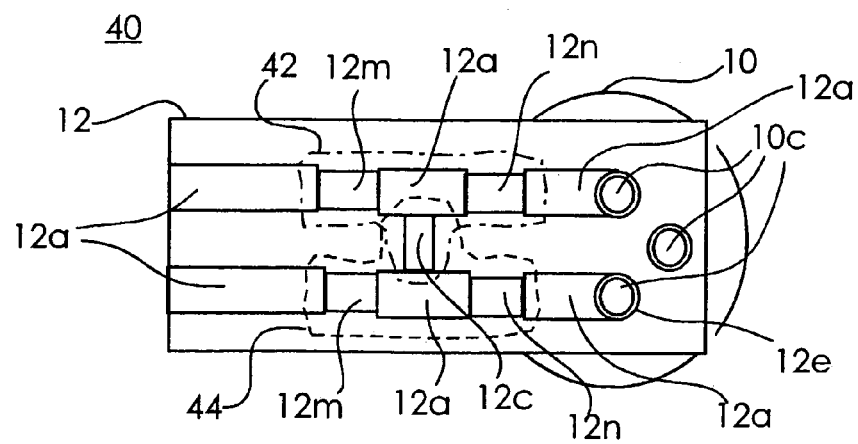
FIG. 30 is a plan view of an optical semiconductor device according to still another modification of one embodiment of the present invention.

FIG. 30 is a plan view of an optical semiconductor device according to still another modification of one embodiment of the present invention.

In the construction shown in FIG. 30, in which "T" type attenuator 42 and 44 are composed, further a resistors 12n serving as a third resistance element are connected with the thin-film resistors 12m in series through the intermediate of the resistor 12c in addition to the thin-film resistors 12m and the resistor 12c connected to the transmission lines 12a as shown in FIG. 29.

As in the case of the laser device 40 as shown in FIG. 28, the laser device 40 as shown in FIG. 29 and the laser device 40 as shown in FIG. 30 attenuates the resonance of the high-frequency signals taking place due to the flexible substrate acting like a resonator. This arrangement restrains the resonance and the interference of high frequencies. These constructions have same advantage as the laser device 40 shown in FIG. 28.

As described above, in the laser device 40 according to the present embodiment, the thin-film resistors 12m connected in series with the transmission lines 12a, the thin-film resistors 12m and a parallel resistor 12c, and a "T" type attenuator or a "π" type attenuator attenuate resonance caused by the flexible substrate 12 acting as a resonator because of the reflection of high-frequency signals in the connection area of the flexible substrate 12 and the can package 10, so that the interference of high frequencies is restrained. Hence, surges of a few GHz pitch developed in the frequency characteristics of the transmission characteristic S21 or the reflection characteristic S11 will be smaller, resulting in reduced distortion of the waveforms of high-frequency signals propagated on the flexible substrate. Thus, it is possible to construct a laser device that minimizes distortion of waveforms of modulation signals of laser oscillation, exhibiting good high-frequency characteristics.

In the fifth embodiment, the description has been given of the thin-film resistors 12m connected in series with the transmission lines 12a and the resistor 12c connected in parallel to the thin-film resistors 12m and the transmission lines 12a or a "T" type attenuator 42 or a "π" type attenuator 44 are provided on the flexible substrate 12. Alternatively, however, the thin-film resistors 12m connected in series with the transmission lines, the thin-film resistor 12m connected in series with the transmission lines in combination with the resistor 12c connected in parallel to the transmission lines 12a, or the "T" type attenuator 42 or the "π" type attenuator or the like may be disposed on the circuit board 14 and connected to the transmission lines 14a to obtain the same advantage.

This is because the electrical reflection taking place in the connection area of the flexible substrate 12 and the can package 10, which is responsible for the resonance, is propagated to the transmission lines 14a via the transmission lines 12a, so that the same advantage can be obtained by absorbing the reflected high-frequency signals on the circuit board 14 to attenuate them.

Sixth Embodiment

Figure 31:
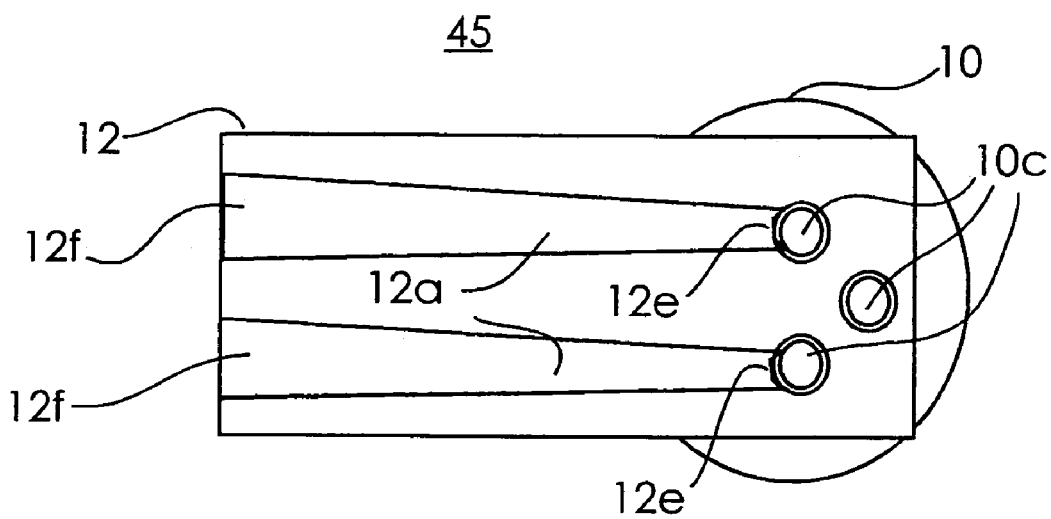
FIG. 31 is a plan view of an optical semiconductor device according to a sixth embodiment of the present invention.
Figure 32:
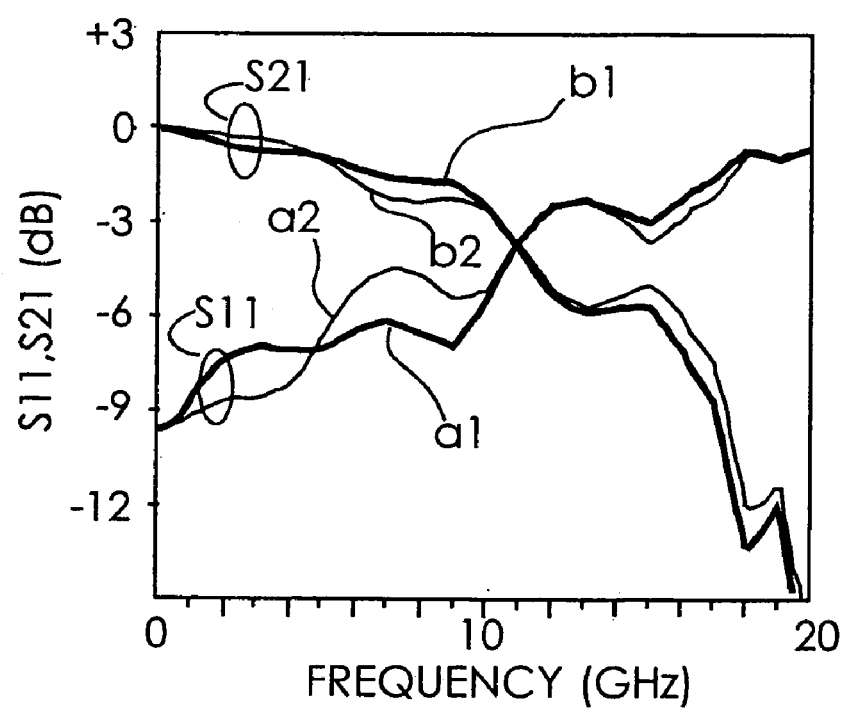
FIG. 32 is a graph showing the calculation results of the frequency characteristics of reflection characteristic S11 and the transmission characteristic S21 of the laser device according to the present invention.

FIG. 31 is a plan view of an optical semiconductor device according to a sixth embodiment of the present invention. FIG. 32 is a graph showing the calculation results of the frequency characteristics of reflection characteristic S11 and the transmission characteristic S21 of the laser device according to the present invention.

In the sixth embodiment, the description will be given of an example of the flexible substrate 12 when square-wave, high-frequency signals having positive/negative phases are applied to two transmission lines 12a to perform laser drive based on differentials. However, the present embodiment provides the same advantage also when it is applied to the flexible substrate 12 used in the case where the single transmission line 12a and the metal film 12g provided on the back surface of the flexible substrate 12 are used to propagate high-frequency modulation signals to drive the laser diode 10h of the can package 10, as in the case of the single-phase drive, floating drive or the like explained in connection with the fourth embodiment.

To connect a flexible substrate 12 with the circuit board transmission lines 14a of the circuit board 14, the flexible substrate 12 of a laser device 45 shown in FIG. 31 has transmission lines 12a that are formed to be tapered from lands 12f toward through holes 12e, in which lead terminals 10c are inserted, so that impedance gradually increases from the lands 12f of the transmission lines 12a toward the through holes 12e such that the width of the transmission lines 12a are formed into gradually narrower from lands 12f toward through holes 12e.

The characteristic impedance of the circuit board transmission lines 14a is required to set normally to 50 Ω so as to restrain the reflection of high-frequency signals in connection area A of the circuit board 14 and the flexible substrate 12, which is adjacent to the lands 12f. In order to accomplish impedance matching between the flexible substrate 12 and the lead terminals 10c of the can package 10, the impedance is set to be higher in the area near the through holes 12e, which is the connection area of the lead terminals 10c of the transmission lines 12a. This reduces the reflection of high-frequency signals.

Referring to the graph of FIG. 32, reflection characteristic S11 of the laser device 45 according to the sixth embodiment is indicated by a curve a1 and transmission characteristic S21 thereof is indicated by a curve b1. For the purpose of comparison, reflection characteristic S11 of a laser device having a conventional construction, that is, a laser device with transmission lines 12a that are formed into an uniform width, indicated by a curve a2, while transmission characteristic S21 thereof is indicated by b2.

Transmission characteristic S21 of the laser device with the conventional construction rises near at 7 GHz. It is due to increase of reflection characteristic S11 of the laser device, because the impedance at the lead terminals 10c provided on the can package 10 rises near at 7 GHz.

The impedance in the vicinity of the lead terminals 10c of the can package 10 being set higher leads reflection characteristic S11 not to rise on the case that the impedance at the lead terminals 10c increases near at 7 GHz.

As shown in FIG. 32, reflection characteristic S11 of the laser device 45 shows an improvement of about 1.5 dB in the vicinity of 7 GHz, and an improvement on falling down of transmission characteristic S21 in the vicinity of 7 GHz, as compared with the laser device with the conventional construction.

As described above, in the laser device according to the sixth embodiment, the flexible substrate 12 of a laser device 45 has transmission lines 12a that have tapered width gradually narrower from the lands 12f of the transmission lines 12a toward the through holes 12e, so that impedance gradually increases from the lands 12f in which connects a flexible substrate 12 with the circuit board transmission lines 14a of the circuit board 14 toward through holes 12e in which lead terminals 10c are inserted.

As in the case of the first embodiment, this arrangement matches the impedance of the transmission lines 12a near the through holes of the flexible substrate 12 and the impedance of the lead terminals 10c on the outer side of the can package 10. As a result, the reflection of high-frequency signals is reduced and the interference of high frequencies caused by the flexible substrate 12 acting as a resonator is restrained, leading to less distortion in the waveforms of high-frequency signals propagating the flexible substrate 12. This in turn restrains the distortion of the waveforms of modulation signals of laser oscillation, making it possible to configure a laser device that exhibits good high-frequency characteristics.

In the first through the sixth embodiments described above, the thin-film resistors 12m connected in series with the transmission lines, the thin-film resistors 12m in combination with the resistor 12c connected in parallel between the transmission lines, or the "T" type attenuator 42 or a "π" type attenuator or the like may be additionally disposed on the circuit board 14.

If the thin-film resistors 12m is disposed in series to the transmission lines 14a on the circuit board 14, or if a combination of the thin-film resistors 12m, which are connected in series to the transmission lines 14a, and the resistor 12c connected in parallel between the transmission lines 14a is provided, or if the "T" type attenuator 42 or a "π" type attenuator is disposed on the transmission lines 14a, then the resonance that takes place due to the connection of the flexible substrate 12 and the can package 10 will be absorbed and attenuated, as in the case where the above components are provided on the flexible substrate 12.

This arrangement improves the problem of the surges of a few GHz pitches that are developed in the frequency characteristic of transmission characteristic S21 of the entire area from the circuit board 14 to the laser diode 10h.

The above descriptions of the embodiments have referred to the laser devices as examples of optical semiconductor devices. The present invention, however, provides the same advantages when it is applied to optical semiconductor devices using light receiving elements, such as photo diodes.

Thus, optical semiconductor devices according to the present invention are ideally used with light receiving/emitting devices for optical communication that are required to provide excellent modulation characteristics at low cost.

While the presently preferred embodiments of the present invention have been shown and described. It is to be understood these disclosures are for the purpose of illustration and that various changes and modifications may be made without departing from the scope of the invention as set forth in the appended claims.

The invention claimed is:

1. An optical semiconductor device comprising:
   an optical semiconductor package including
      a substrate that has a first main surface and a second main surface opposed to each other, and a through hole penetrating the first and second main surfaces,
      a semiconductor optical element disposed on the first main surface of the substrate,
      an electrode terminal disposed in the through hole of the substrate with a first end exposed on the second main surface of the substrate, secured to the substrate by a sealant, and connected to the semiconductor optical element through a signal line, and
      a cap member covering the first main surface of the substrate and sealing the semiconductor optical element;
   a flexible substrate having a flexible dielectric film and a signal transmission line on a front surface of the dielectric film, a first end of the signal transmission line being electrically connected to the electrode terminal of the optical semiconductor package on a second main surface side of the substrate of the optical semiconductor package; and
   impedance matching means matching impedance of the signal transmission line of the flexible substrate and impedance of the electrode terminal of the optical semiconductor package at the second main surface side of the substrate.

2. The optical semiconductor device according to claim 1, including a plurality of the signal transmission lines on the flexible substrate, arranged side-by-side, wherein the impedance matching means is shunt-connected between a pair of the signal transmission lines.

3. The optical semiconductor device according to claim 2, wherein the impedance matching means includes a resistance element between two of the signal transmission lines on the flexible substrate.

4. The optical semiconductor device according to claim 3, further comprising a capacitance element located between two of the signal transmission lines, the capacitance element being connected in series with the resistance element.

5. The optical semiconductor device according to claim 4, including capacitance elements on both sides of the resistance element.

6. The optical semiconductor device according to claim 1, wherein the impedance matching means includes a gradually increasing impedance of the signal transmission line, gradually increasing toward the first end of the signal transmission line.

7. The optical semiconductor device according to claim 6, wherein the signal transmission line has a width gradually decreasing toward the first end of the signal transmission line.

8. The optical semiconductor device according to claim 2, further comprising a conductive film on a back surface of the dielectric film, opposing one of the signal transmission lines on the flexible substrate, wherein the impedance matching means is shunt-connected between one of the signal transmission lines and the conductive film of the flexible substrate.

9. The optical semiconductor device according to claim 8, wherein the impedance matching means includes a resistance element on a front surface of the dielectric film.

10. The optical semiconductor device according to claim 9, wherein the impedance matching means comprises a capacitance element connected in series with the resistance element.

11. The optical semiconductor device according to claim 2, wherein the impedance matching means is connected in series with one of the signal transmission lines.

12. The optical semiconductor device according to claim 11, wherein the impedance matching means includes a first resistance element.

13. The optical semiconductor device according to claim 12, further comprising a second resistance element, wherein the first resistance element is provided for each of two of the signal transmission lines, and the second resistance element is shunt-connected between the two signal transmission lines.

14. The optical semiconductor device according to claim 13, further comprising a third resistance element, wherein the first resistance element and the third resistance element are connected in series with two of the signal transmission lines through the second resistance element as an attenuator.

15. The optical semiconductor device according to claim 12, further comprising a conductive film and a second resistance element, wherein the conductive film is on the back surface of the dielectric film, opposing one of the signal transmission lines on the dielectric film of the flexible substrate, and including a second resistance element shunt-connected between the signal transmission line to which the first resistance element is connected and the conductive film.

* * * * *